United States Patent
Gardner

(10) Patent No.: US 10,404,502 B2
(45) Date of Patent: Sep. 3, 2019

(54) COMMON MODE NOISE ATTENUATION TECHNIQUES FOR TWISTED WIRE PAIR

(71) Applicant: Linear Technology LLC, Milpitas, CA (US)

(72) Inventor: Andrew J. Gardner, Santa Barbara, CA (US)

(73) Assignee: Linear Technology LLC, Milpitas ( * ) Notice: Subject to any disclaimer, the term of this patent is extended or adjusted under 35 U.S.C. 154(b) by 0 days.

(21) Appl. No.: 15/908,418

(22) Filed: Feb. 28, 2018

(65) Prior Publication Data

US 2018/0254931 A1 Sep. 6, 2018

Related U.S. Application Data

(60) Provisional application No. 62/465,737, filed on Mar. 1, 2017, provisional application No. 62/465,745, filed on Mar. 1, 2017, provisional application No. 62/467,036, filed on Mar. 3, 2017.

(51) Int. Cl.
| | |
|---|---|
| *H04B 3/00* | (2006.01) |
| *H04L 25/00* | (2006.01) |
| *H04L 25/08* | (2006.01) |
| *H03H 7/42* | (2006.01) |
| *H01R 13/6463* | (2011.01) |
| *H01R 13/6464* | (2011.01) |
| *H04L 25/02* | (2006.01) |
| *H04B 3/30* | (2006.01) |

(52) U.S. Cl.
CPC ....... *H04L 25/085* (2013.01); *H01R 13/6463* (2013.01); *H01R 13/6464* (2013.01); *H03H 7/427* (2013.01); *H04B 3/30* (2013.01); *H04L 25/0266* (2013.01)

(58) Field of Classification Search
CPC .............. H04L 25/085; H04L 25/0266; H04L 25/0276; H04L 12/10; H03H 7/427; H03H 7/0138; H01R 13/6463; H01R 13/6464
USPC ........................ 375/257, 258, 219, 220, 222
See application file for complete search history.

(56) References Cited

U.S. PATENT DOCUMENTS

| | | | |
|---|---|---|---|
| 8,824,570 B2* | 9/2014 | Pischl | H04L 25/0276 375/257 |
| 9,007,148 B2* | 4/2015 | Shibata | H03H 7/0138 333/12 |
| 2012/0246496 A1* | 9/2012 | Guillot | H04L 12/10 713/300 |
| 2016/0308683 A1* | 10/2016 | Pischl | H04L 12/10 |

* cited by examiner

*Primary Examiner* — Phuong Phu
(74) *Attorney, Agent, or Firm* — Patent Law Group LLP; Brian D. Ogonowsky

(57) ABSTRACT

Various techniques are described to terminate a differential wire pair using combinations of CMCs, transformers, autotransformers, differential mode chokes (DMCs), and AC-coupling capacitors. The techniques improve the AC common mode insertion loss without attenuating the differential data signals, while easing the requirements of the CMC. In one example, an autotransformer, having a first winding, a second winding, and a center tap, is connected across a PHY, where the center tap provides a low impedance to ground for attenuating common mode noise. A CMC is coupled across the autotransformer and a pair of wires carrying differential data, where the CMC greatly attenuates common mode noise. The requirements of the CMC are reduced due to the autotransformer.

18 Claims, 10 Drawing Sheets

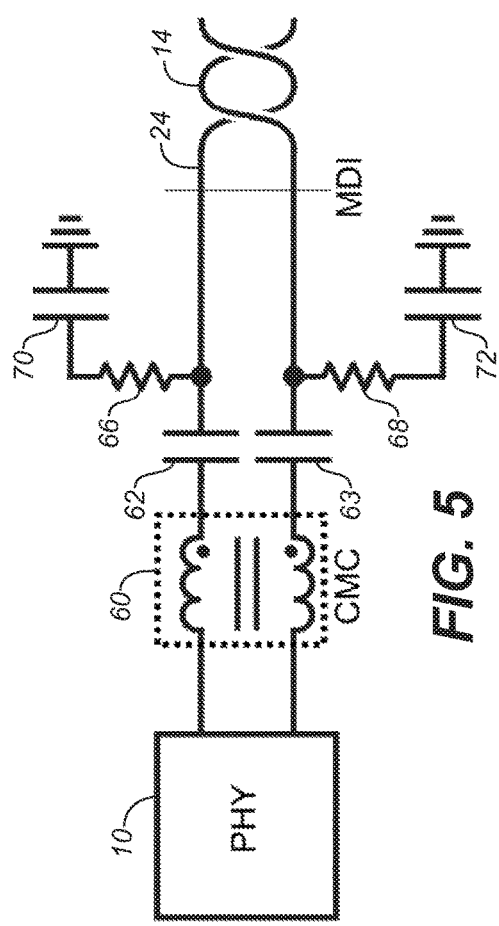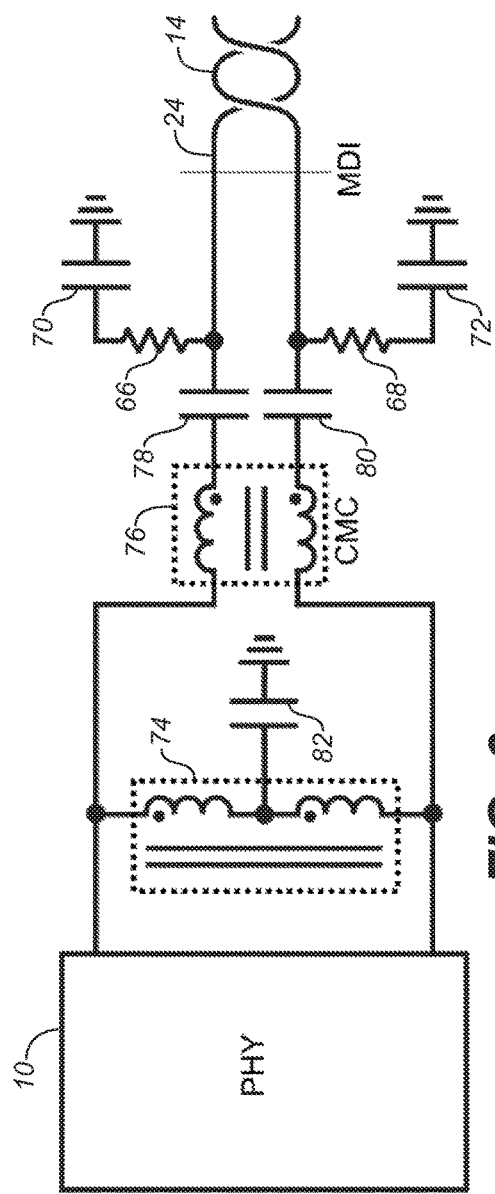

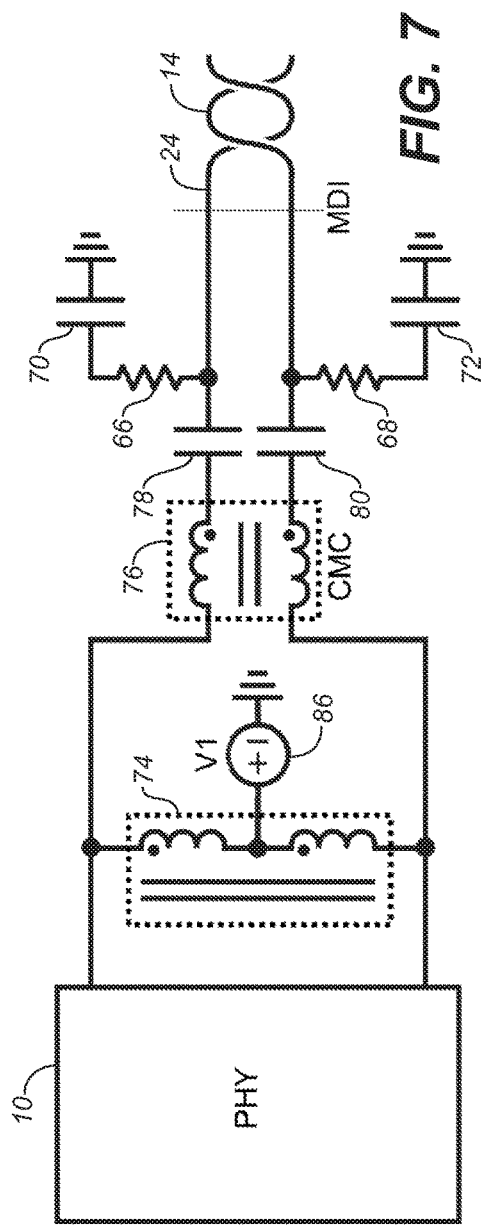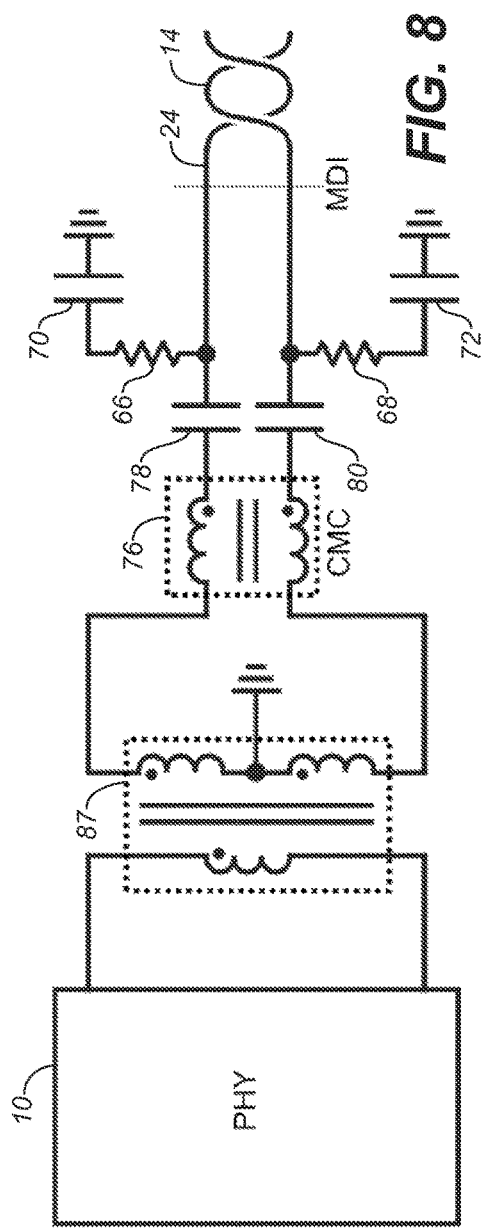

COMMON MODE NOISE ATTENUATION TECHNIQUES FOR TWISTED WIRE PAIR

CROSS-REFERENCE TO RELATED APPLICATIONS

This application is based on and claims priority from U.S. Provisional Application Ser. Nos. 62/465,737, filed Mar. 1, 2017; 62/465,745, filed Mar. 1, 2017; and 62/467,036, filed Mar. 3, 2017, by Andrew J. Gardner, all applications incorporated herein by reference.

FIELD OF THE DISCLOSURE

The inventions relate to communication systems using differential data over a twisted wire pair and, in particular, to techniques for improving the common mode insertion loss characteristics.

BACKGROUND

A common mode choke (CMC) removes common mode noise from a differential wire pair, and the extent of filtering out the common mode noise is referred to as common mode insertion loss. In data transmission applications that use unshielded twisted pair (UTP) cable, the common mode insertion loss of the CMC used by the data physical link layer devices (PHYs) at each end of the cable is critical to preserving the integrity of the data communications link in the presence of common mode noise.

Common mode insertion loss is limited by several constraints on the CMC such as footprint, inter-winding capacitance, leakage inductance, the DCR of the windings, and core loss. In addition the CMC must have low insertion loss and high return loss as required by the differential data transmitted between the PHYs. For applications using UTP cables that need to achieve very low bit error rates in noisy environments, it may not be feasible for a conventional CMC to achieve the required common mode insertion loss. The solution to this impasse usually entails replacing the UTP cable and connectors with relatively expensive shielded cable and connectors.

Better techniques are needed to remove common mode noise from a wire pair carrying differential data.

SUMMARY

Various techniques are described to terminate a differential wire pair using combinations of CMCs, transformers, autotransformers, differential mode chokes (DMCs), and AC-coupling capacitors. The techniques improve the AC common mode insertion loss without significantly attenuating the differential data signals, while easing the requirements of the CMC.

BRIEF DESCRIPTION OF THE DRAWINGS

FIG. 5 shows one type of termination for a differential data communications system, where a PHY relies upon a CMC to impede common mode signals in a balanced, twisted-pair cable application and shunt AC coupled resistors at the MDI to terminate common mode signals.

FIG. 6 illustrates one embodiment of the invention that uses a center-tapped autotransformer as a shunt DMC where the center-tap is AC coupled to ground.

FIG. 7 illustrates an alternative embodiment of the invention where the center tap of the autotransformer is DC coupled to ground through a voltage source.

FIG. 8 illustrates an alternative embodiment of the invention where the center-tapped autotransformer is replaced with a transformer, and the MDI-side winding of the transformer is center-tapped and DC coupled to ground through a voltage source.

Elements that are the same or equivalent are labeled with the same element numbers.

DETAILED DESCRIPTION

Figure 1:
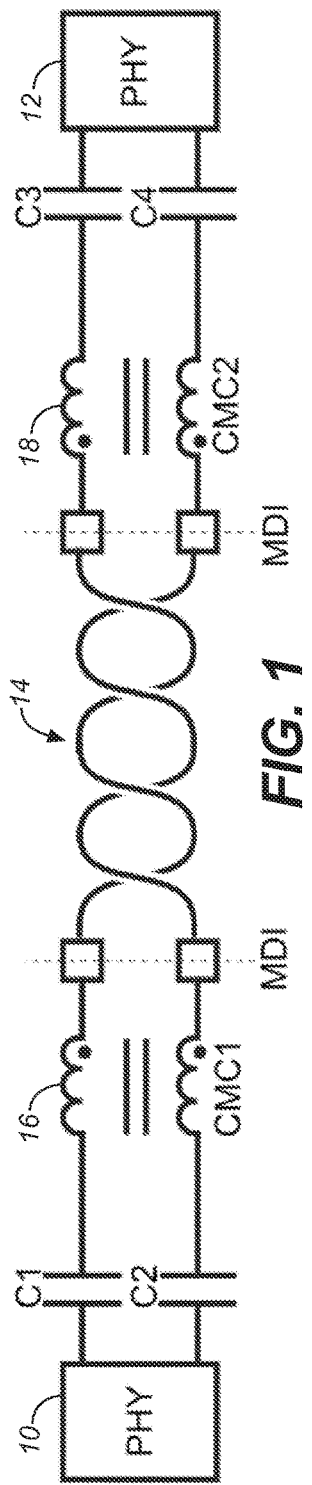
FIG. 1 shows one type of communications link between two PHYs using UTP cable.

Multiple techniques are shown for reducing common mode noise in a differential data communications system. Common Mode Choke and Differential Mode Choke Combination for Data Transmission Over Twisted Wire Pair FIG. 1 shows a communications link between two PHYs 10 and 12 using UTP cable 14. CMCs 16 and 18 are used to filter out common mode noise. AC coupling capacitors C1-C4 filter out DC so that the PHYs 10 and 12 only receive AC coupled differential data. The PHYs 10 and 12 may also transmit AC coupled differential data. The PHYs 10 and 12 contain transceivers and signal conditioning circuitry, and their parameters are typically specified by IEEE standards.

A CMC comprises two coupled windings and is connected in series with the twisted wire pair. As shown by the dots on the CMC windings, the windings have the same polarity for common mode signals, so the magnetic field generated by a differential mode signal is substantially cancelled out. Thus, the CMC presents little inductance or impedance to differential-mode currents. Common-mode currents, however, see a high impedance due to the uncancelled coupled inductance of the windings.

The CMCs ideally eliminate or greatly attenuate common mode RF noise while providing little loss for the differential mode voltage signals. However, CMCs have constraints which limit their ability to impede common mode signals. Such constraints include inter-winding capacitance, DC resistance (DCR) of the windings, and core loss. The CMCs must also present to the differential mode data a low insertion loss and a high return loss.

Combinations of a differential mode choke (DMC) and one or more CMCs are proposed herein that substantially improve common mode insertion loss while preserving the required differential mode return loss and insertion loss. In the following figures, only one PHY is shown for simplicity, and the circuitry may be symmetric at both ends of the wire pair.

Figure 2:
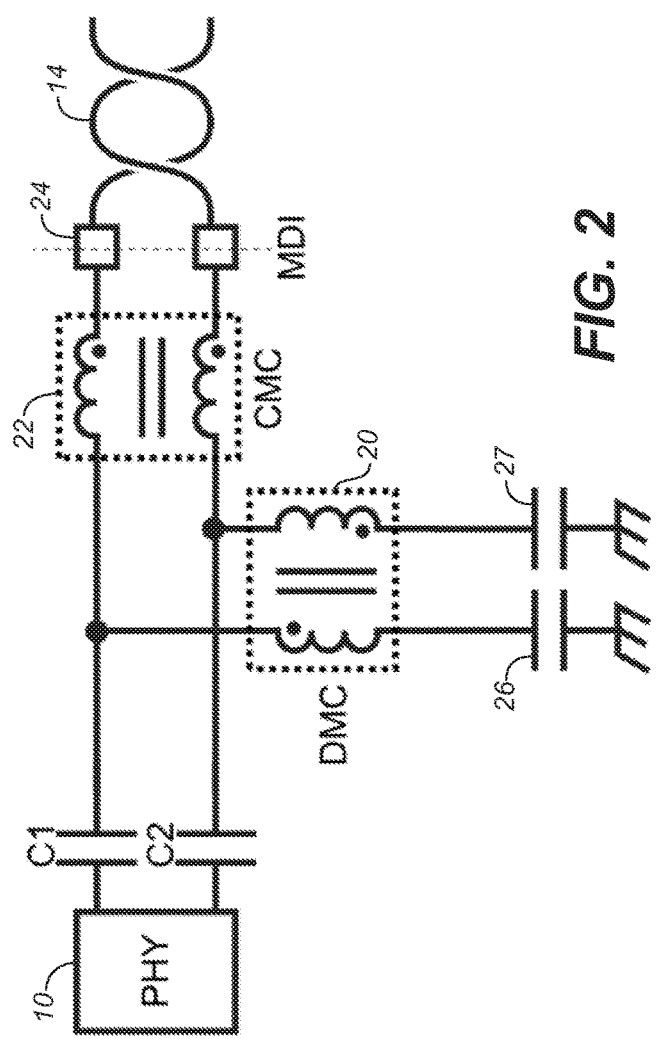
FIG. 2 illustrates a circuit that combines an AC-coupled PHY with a shunt differential mode choke (DMC) and a CMC.

FIG. 2 illustrates a circuit that combines an AC coupled PHY 10 with a shunt DMC 20 and a series CMC 22. This configuration of the CMC 22 and DMC 20 is such that the transmission of an AC common mode signal between the medium dependent interface (MDI) 24 and the PHY 10 is substantially impeded while the transmission of a differential mode signal is not substantially impeded, and the transmission of a common mode signal between the common connections of the CMC 22 and DMC 20 to ground is not substantially impeded while the transmission of an AC differential mode signal is substantially impeded. The DMC 20 shunt connections to ground are AC coupled by capacitors 26 and 27.

In this way, the requirements of the CMC 22 are greatly reduced since any AC common mode noise that passes through the CMC 22 is shunted, via the DMC 20, by the AC coupling capacitors 26 and 27 coupled to ground.

Figure 3:
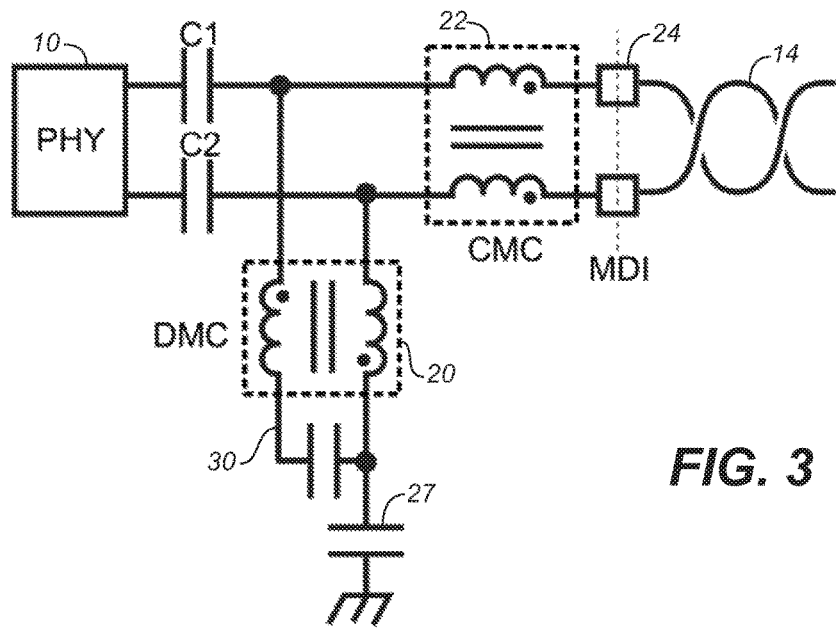
FIG. 3 illustrates another circuit coupled to the shunt DMC to terminate the wires and eliminate the AC common mode signals.

Another circuit coupled to the DMC 20 to terminate the wires and eliminate the AC common mode signals is shown in FIG. 3. In FIG. 3, one terminal of the DMC 20 is coupled to ground via the AC coupling capacitor 27, and the second terminal of the DMC 20 is coupled to a capacitor 30 which is connected to the capacitor 27. This embodiment is generally equivalent to FIG. 2.

Figure 4:
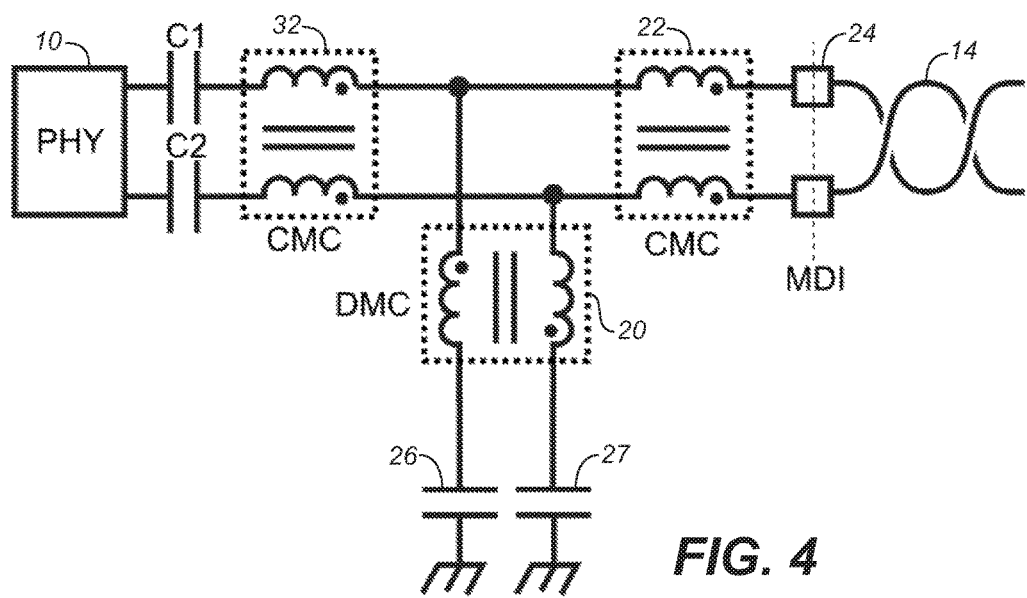
FIG. 4 illustrates a combination of an AC-coupled PHY with two series CMCs and a shunt DMC in a "tee" configuration.

FIG. 4 illustrates a combination of an AC-coupled PHY 10 with two series CMCs 22 and 32 and a shunt DMC 20 in a "tee" configuration. This configuration is such that transmission of a common mode signal between the PHY 10 and the common connections of both CMCs 22/32 and the DMC 20 is substantially impeded while the transmission of a differential mode signal is not substantially impeded. The transmission of a common mode signal between the common connections of the CMCs 22/32 and the DMC 20 to ground is not substantially impeded while the transmission of a differential mode signal to ground is substantially impeded. The transmission of a common mode signal between the common connections of the CMCs 22/32 and the DMC 20 to the MDI 24 is substantially impeded while the transmission of a differential mode signal between the MDI 24 and the common connections is not substantially impeded. The DMC 20 shunt connections to ground are AC coupled. Additional embodiments for coupling the shunt DMC to ground are envisioned. The added CMC 32 at the AC coupling capacitors C1 and C2 further reduces the AC common mode noise while easing the requirements of the DMC 20 and CMC 22, since the AC common mode noise is attenuated by the CMC 22 for incoming signals on the wire pair 14 before reaching the DMC 20, and the AC common mode noise generated on the PHY 10 side (in an outgoing signal) is attenuated by the CMC 32 before reaching the DMC 20. Thus, the PHY 10 may see a high AC common mode impedance due to the CMC 32.

Circuit Techniques for Enhancing Common Mode Choke Performance of Balanced, Twisted-Pair Cable PHYs In data transmission applications that rely upon a balanced twisted-pair cable, the performance of the common mode choke (CMC) used by the data physical link layer devices (PHYs) at each end of the cable is critical to preserving the integrity of the data communications link in the presence of common mode noise.

FIG. 5 shows a termination for a differential data communications system, where a PHY 10 relies upon a CMC 60 to impede common mode signals in a balanced, twisted-pair cable application. The AC coupling capacitors 62 and 63 allow the differential AC data to pass. The RC circuits comprising resistors 66 and 68 and capacitors 70 and 72 provide an AC coupled impedance match for common mode signals.

Common mode insertion loss is limited by a number of constraints on the CMC such as footprint, inter-winding capacitance, the DCR of the windings, and core loss. In addition, the CMC must have low insertion loss and high return loss as required by the transmitted differential mode data. For applications using balanced, twisted-pair cables that need to achieve very low bit error rates in noisy environments, it may not be feasible for a conventional CMC to achieve the required common mode insertion loss. The solution to this impasse may require using relatively expensive shielded cable and connectors in order to mitigate the requirements on the CMC or eliminate the requirement for a CMC altogether.

A combination of a center-tapped autotransformer or a transformer with a center-tapped secondary winding and a CMC is proposed herein that substantially improves upon the common mode insertion loss feasible with a simple CMC in PHY applications that use balanced, twisted-pair cables.

FIG. 6 illustrates one embodiment of the invention that uses a center-tapped autotransformer 74. An autotransformer is a transformer with only one winding. In an autotransformer, portions of the same winding act as both the primary and the secondary sides of the transformer. It is possible to configure two identical, coupled inductors as a center-tapped autotransformer by connecting the inductors in series with their polarities adding. In contrast, an ordinary transformer has separate primary and secondary windings that are galvanically isolated.

The PHY 10 is coupled to the MDI 24 through a CMC 76 and DC blocking capacitors 78 and 80. The center-tapped autotransformer 74 is connected in shunt between the two terminals of the PHY 10. The center-tap of the autotransformer 74 is AC-coupled to common mode ground through the capacitor 82. The two MDI 24 connector terminals have AC-coupled common mode noise terminations to common mode ground via the RC circuits comprised of the resistors 66/68 and capacitors 70/72. The common mode terminations minimize reflections of common mode signals that are incident at the MDI 24.

The CMC 76 substantially impedes AC common mode signals but does not substantially impede differential mode signals. Common mode signals that are applied at the two terminals of the autotransformer 74 common with the PHY 10 terminals see a low impedance path to common mode ground, due to the indicated polarities of the windings, while the differential mode signals of the PHY 10 see a relatively high AC impedance. Consequently, AC differential mode signals are transmitted between the MDI 24 and the PHY 10 with low loss while AC common mode signals are transmitted with a loss that is substantially greater than what can be achieved using the simple series CMC configuration shown in FIG. 5. The use of the autotransformer 74 along with the CMC 76 reduces the requirements of the CMC 76 and improves the common mode noise rejection, compared with the configuration of FIG. 5, with little or no adverse effect on the differential mode data.

Another CMC may be inserted between the autotransformer 74 and the PHY 10 so the PHY 10 sees a high common mode impedance. The additional CMC may further reduce the transmission of common mode noise beyond what is feasible with a single CMC.

A center-tapped autotransformer, such as shown in FIG. 6, may also replace the DMC 20 in FIG. 4.

FIG. 7 illustrates an alternative embodiment of the invention where a DC voltage is applied at the center tap of the autotransformer 74 using a voltage source 86. The voltage source 86 is assumed to have a low impedance for shunting the AC common mode noise to ground. One use of the embodiment of FIG. 7 is to supply a DC voltage (relative to system ground) on the wire pair 14 to power a powered device (PD) connected at the other end; however, the AC-blocking capacitors 78 and 80 need to be moved to the input of the PHY 10.

FIG. 8 illustrates an alternative embodiment of the invention where the center-tapped autotransformer is replaced with a transformer 87, and the MDI-side winding of the transformer 87 is center-tapped and connected to common mode ground. This embodiment provides added isolation of the PHY 10 at the expense of increased complexity.

Figure 9:
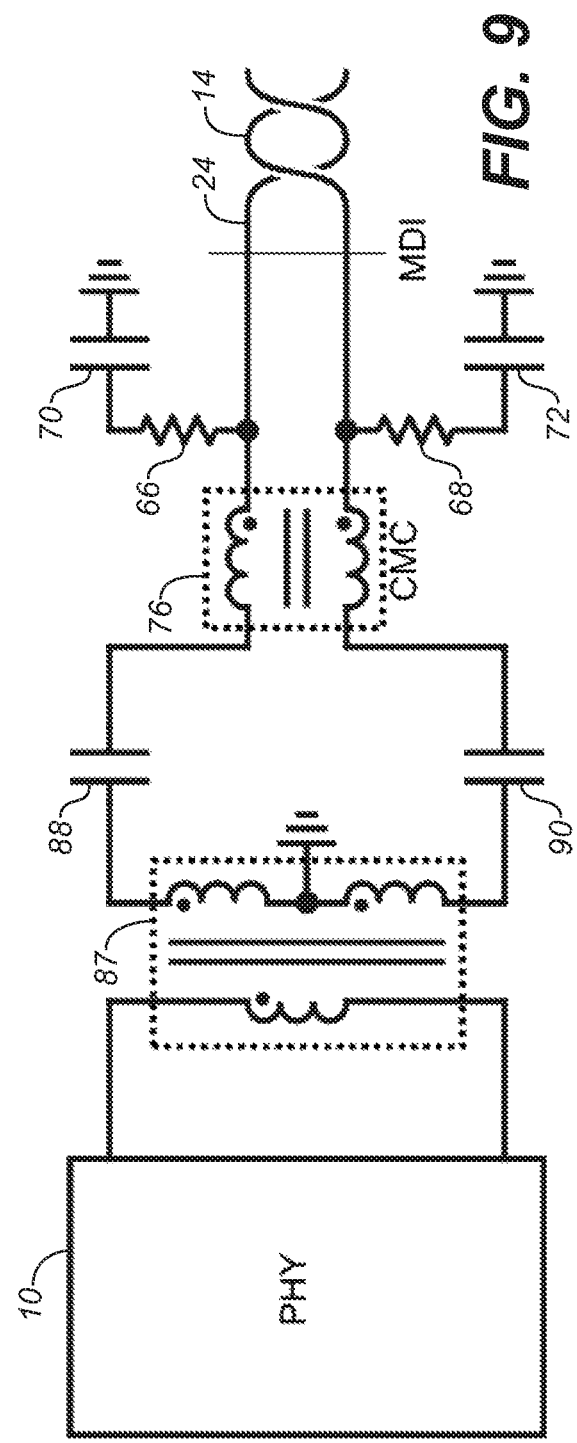
FIG. 9 illustrates another embodiment of the invention where the positions of the CMC and DC blocking capacitors are swapped compared to the embodiment shown in FIG. 8.

FIG. 9 illustrates another embodiment of the invention where the positions of the CMC 76 and DC blocking capacitors 88 and 90 are swapped compared to the embodiment shown in FIG. 8.

Figure 10:
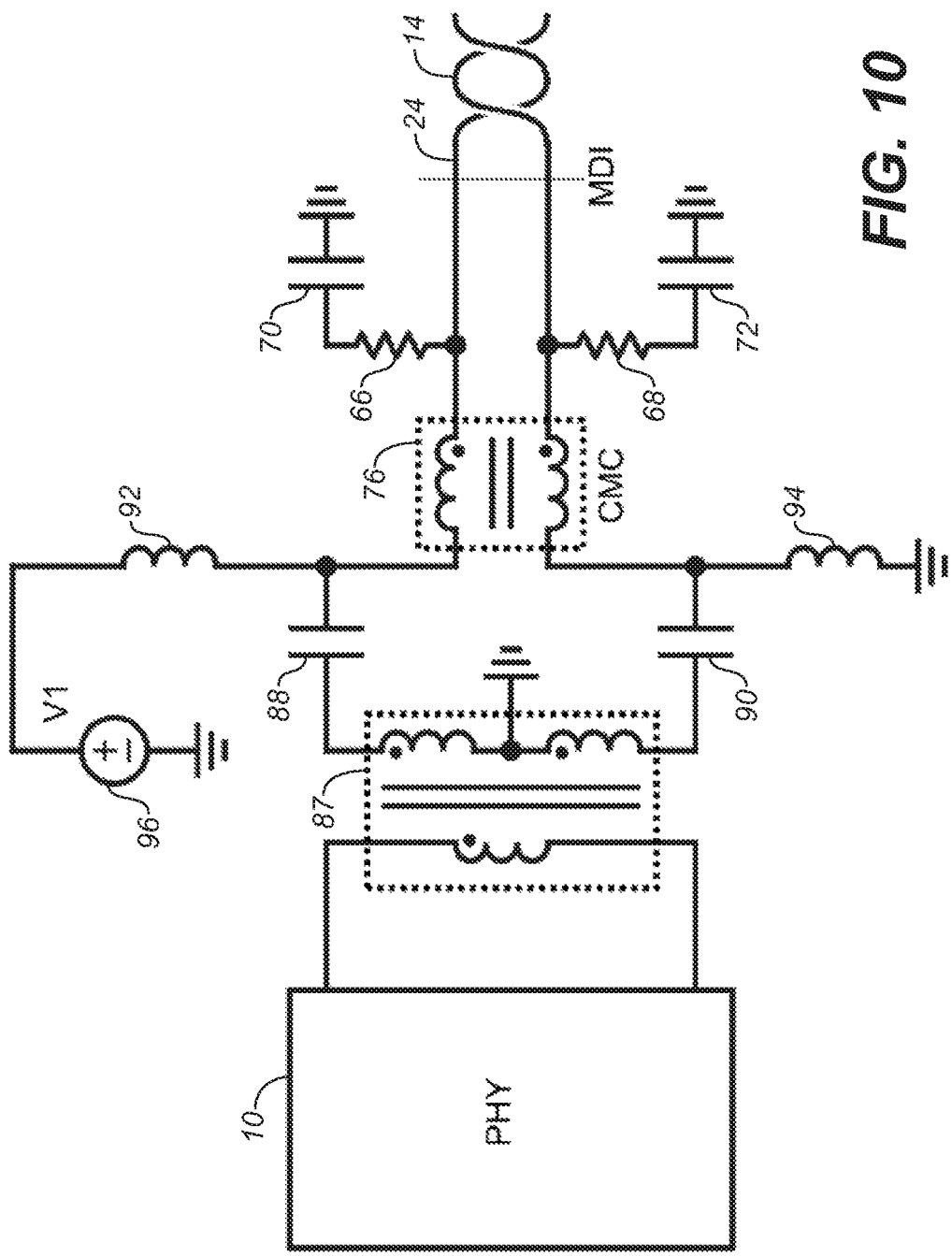
FIG. 10 illustrates a variation of the embodiment in FIG. 9 where DC coupling inductors are added at the PHY—side terminals of the CMC in order to diplex DC voltage generated by the voltage source onto the two conductors of the balanced, twisted-pair cable.

FIG. 10 illustrates a variation of the embodiment in FIG. 9 where DC coupling inductors 92 and 94 are added at the PHY-side terminals of the CMC 76 in order to diplex DC voltage generated by the voltage source 96 onto the two conductors of the balanced, twisted-pair cable 14. The DC voltage is used to power a load at the other end of the wires 14 in a Power over Data Lines (PoDL) network.

Figure 11:
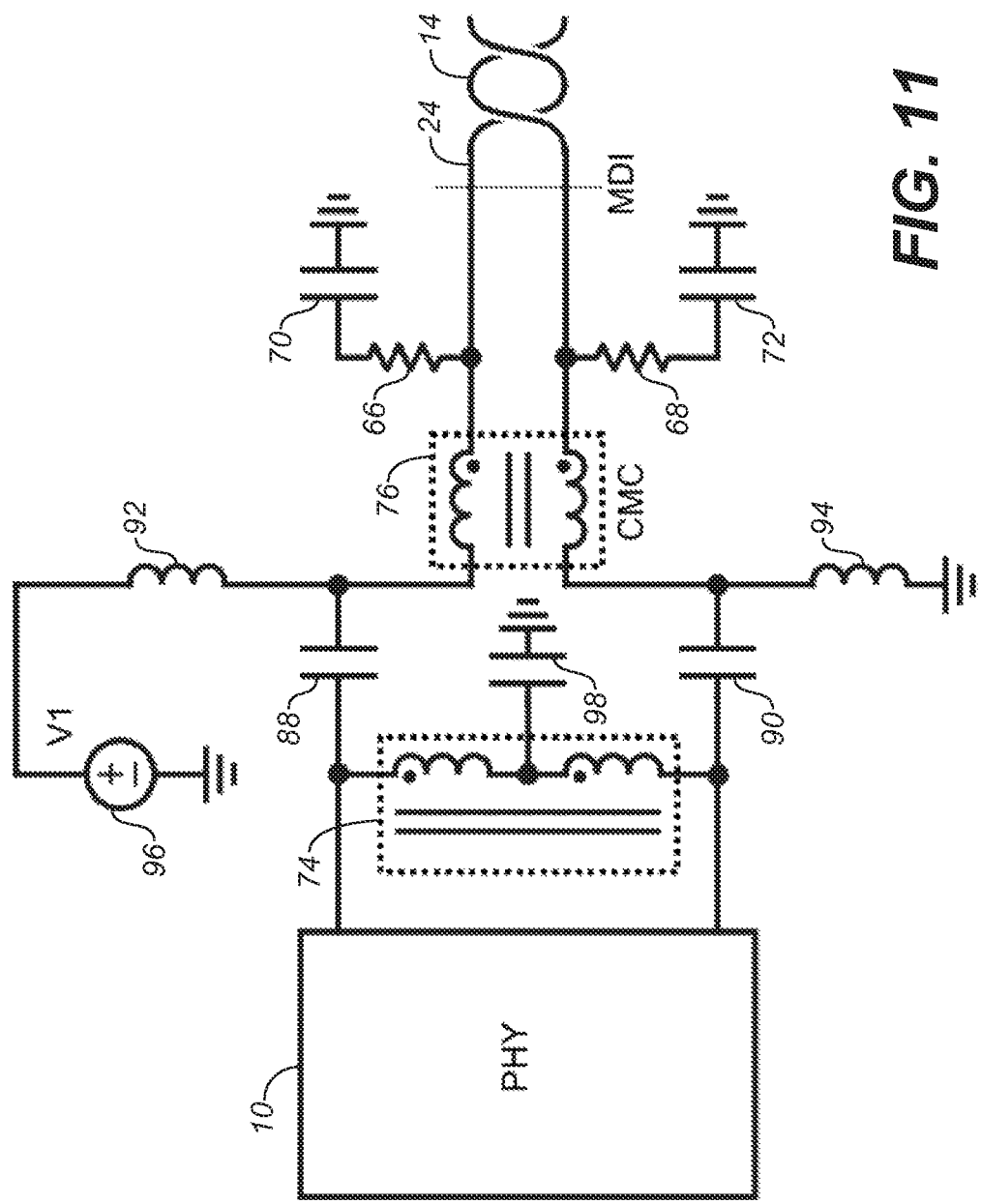
FIG. 11 illustrates an alternative embodiment to FIG. 10 where the center-tapped transformer is replaced with a center-tapped autotransformer and where the center tap of the autotransformer is AC-coupled to ground via a capacitor.

FIG. 11 illustrates an alternative embodiment to FIG. 10 where the center-tapped transformer is replaced with a center-tapped autotransformer 74 and where the center tap of the autotransformer 74 is AC coupled to ground via the capacitor 98. The benefits of using an autotransformer were previously explained with reference to FIG. 6.

Figure 12:
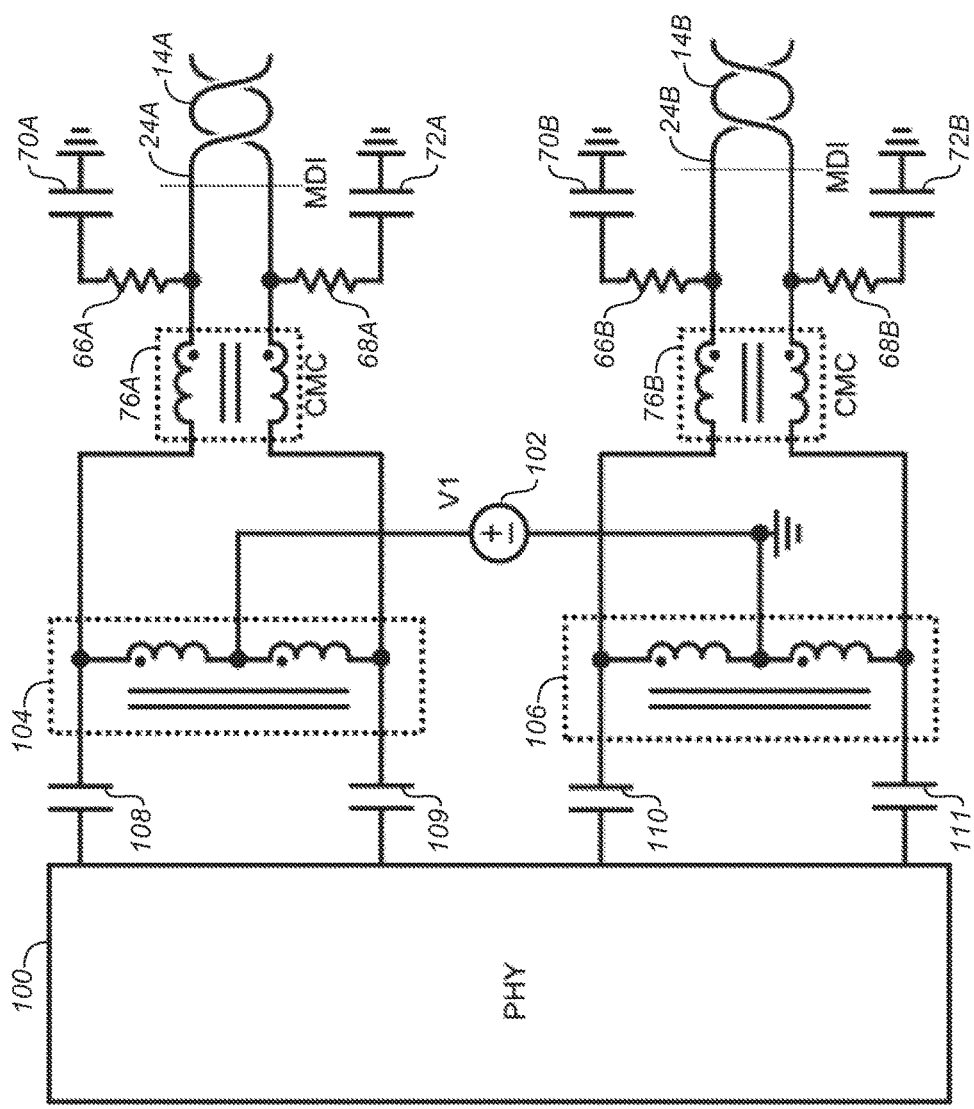
FIG. 12 illustrates an embodiment of the invention for a two-pair PHY. A common mode DC voltage is applied across the center taps of the autotransformers in order to provide a common mode voltage on the two conductors of each of the balanced, twisted-pair cables.

FIG. 12 illustrates an embodiment of the invention for a two-pair PHY 100. A common mode DC voltage, generated by the voltage source 102, is applied across the center taps of the autotransformers 104 and 106 in order to provide a common mode voltage on the two conductors of each of the balanced, twisted-pair cables 14A and 14B. DC blocking capacitors 108-112 isolate the terminals of the PHY 100 from the DC voltage present on the conductors of the balanced, twisted-pair cables 14A and 14B. Since the terminations of the cables 14A and 14B are identical, the corresponding component pairs are labeled A and B.

This configuration is used for a Power over Ethernet system, where one wire pair conducts one DC potential (the plus voltage of the voltage source 102), and the other wire pair conducts another DC potential (the minus voltage of the voltage source 102), and the difference in the potentials is used to power a load at the other end of the wire pairs.

Figure 13:
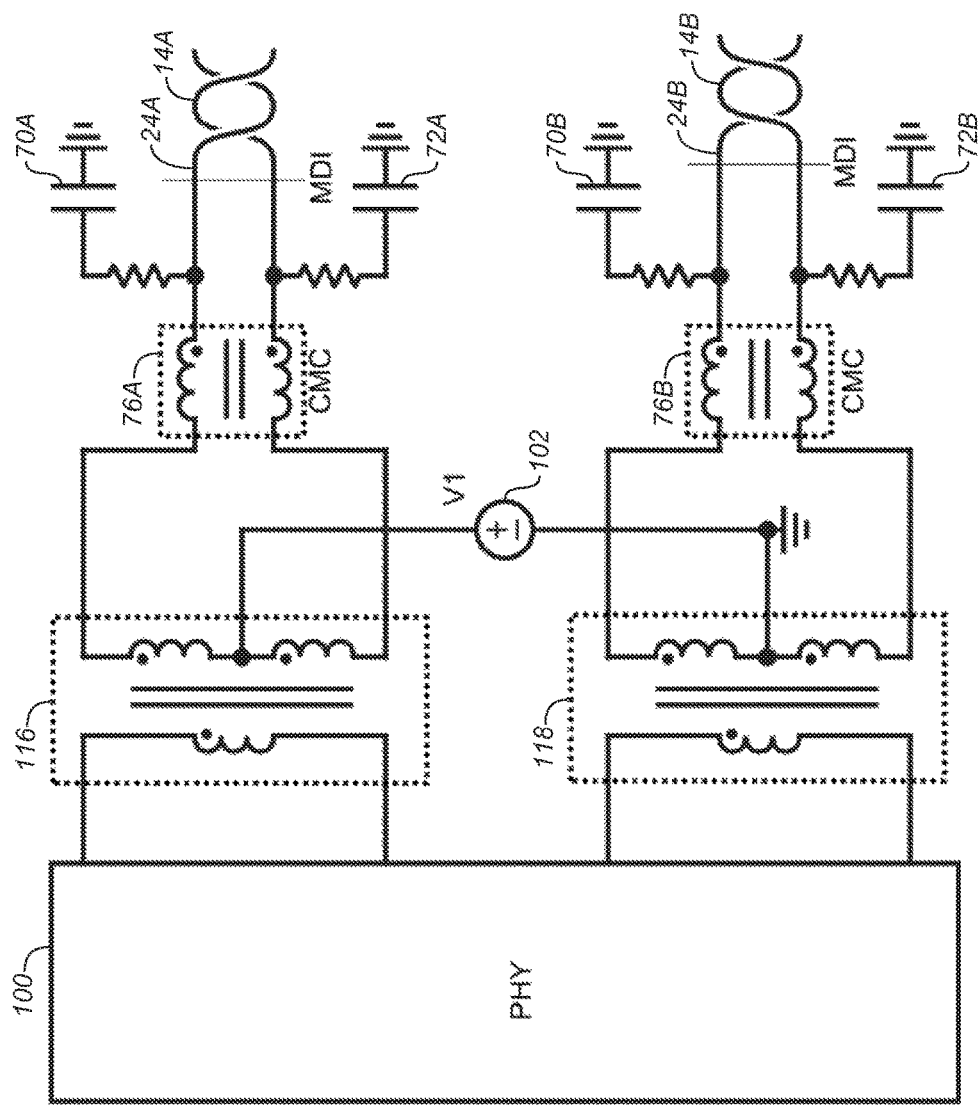
FIG. 13 illustrates an alternative embodiment where the autotransformers of FIG. 12 are replaced with transformers and the PHY terminals are galvanically isolated from the MDI.

FIG. 13 illustrates an alternative embodiment where the autotransformers of FIG. 12 are replaced with transformers 116 and 118 and the PHY 100 terminals are galvanically isolated from the MDIs 24A and 24B. A DC voltage, generated by the voltage source 102, is applied across the center taps of the transformers 116 and 118 in order to provide a common mode voltage on the two conductors of each of the balanced, twisted-pair cables 14A and 14B.

In the embodiments of FIGS. 6-13, common mode signals that can degrade the integrity of a PHY's differential signal are shunted to ground through the low common mode impedance of a center-tapped transformer or an autotransformer on the PHY side of a CMC. The PHY may be directly connected to the terminals of the CMC, connected through DC blocking capacitors, connected through a transformer interface, or connected through a series combination of both a transformer interface and DC blocking capacitors. The MDI-facing terminals of the CMC may be connected to the MDI directly or through DC blocking capacitors. Common mode terminations may be present at the MDI in order to prevent unwanted reflections of common mode signals incident at the MDI. A DC voltage may be applied to the conductors of the balanced, twisted-pair cable using coupling inductors for one-pair PHYs or the center-tap of a transformer or autotransformer for PHYs that rely upon two or more balanced, twisted-pair cables for the transmission of data.

One-Pair Ethernet with Power over Data Lines (PoDL) for Coaxial Cables

Figure 14:
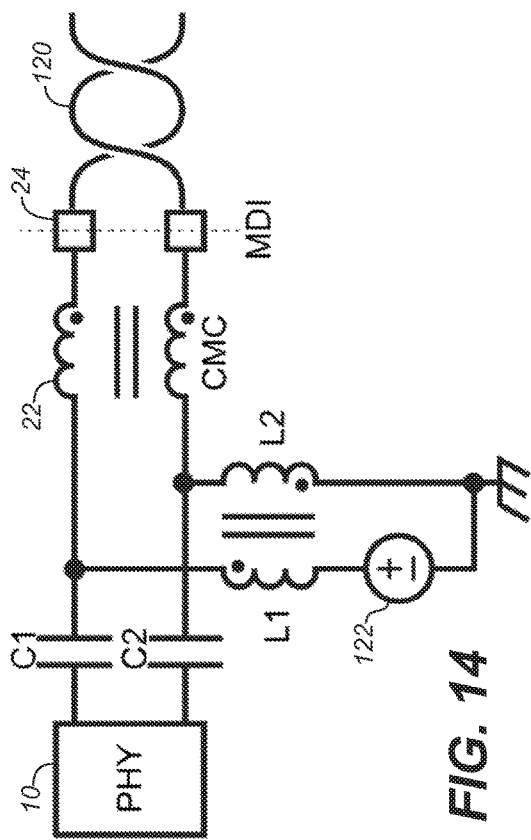
FIG. 14 illustrates a circuit where one wire-pair Ethernet with Power over Data Lines (PoDL) is used with balanced twisted pair cables.

One wire-pair Ethernet with Power over Data Lines (PoDL) is typically used with balanced twisted pair cables 120, as shown in FIG. 14. In FIG. 14, a DC voltage source 122 is coupled to the input of the CMC 22 via DC coupling inductors L1 and L2. The inductors L1 and L2 impede differential AC signals. The CMC 22 does not impede the DC voltage since it is not a common mode AC signal.

In some cases, however, it may be useful to send one wire-pair Ethernet data with DC power over a coaxial cable, such as in a very noisy environment.

Figure 15:
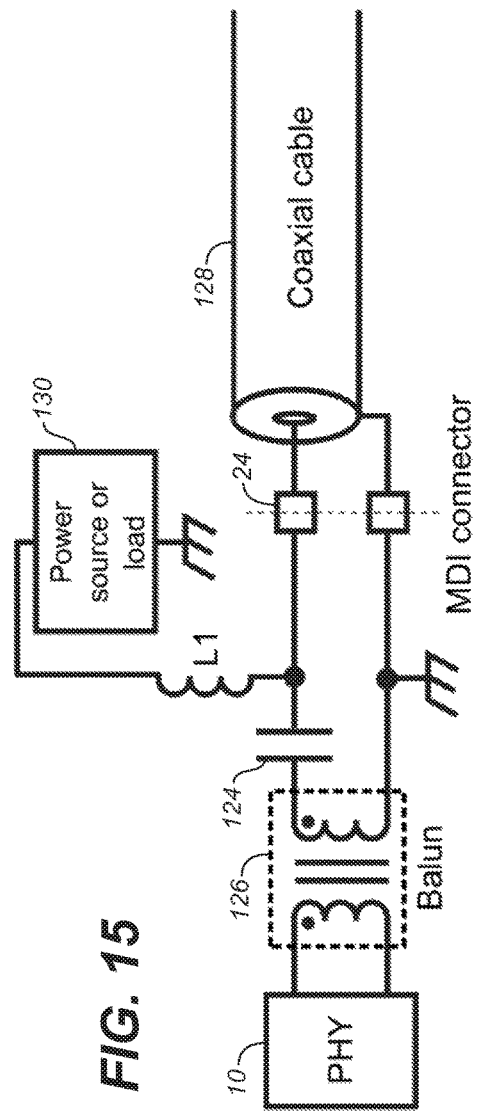
FIG. 15 illustrates a power coupling circuit for a one-wire pair Ethernet PHY that allows transmission of both differential data and DC power over a coaxial cable.

A power coupling circuit for a one-wire pair Ethernet PHY with PoDL that allows transmission of both differential data and DC power over a coaxial cable is described below with reference to FIG. 15. FIG. 15 is similar to the circuit of FIG. 3 in US Publication 20160308683, assigned to Broadcom Corporation, except that a DC blocking capacitor 124 has been added to the circuit. The Broadcom circuit would not work without the capacitor 124, and so the Broadcom disclosure is not enabling for that circuit.

The circuit of the present FIG. 15 uses a balun 126 to transform the balanced, differential interface of the PHY 10 to the single-ended interface of the coaxial cable 128. The outer shield of the coaxial cable 128 is grounded to shield the center wire from external noise. The DC blocking capacitor 124 isolates the MDI-side winding of the balun 126 from the DC voltage present between the two conductors of the cable 128. An inductor L1 is used to couple the DC power source 130 or load (coupled to the other end of the cable 128) into the two conductors of the cable 128. Additional schemes for isolating the MDI-side winding of the balun 126 from the DC voltage between the two conductors of the cable 128 are envisioned.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A system for filtering AC common mode signals from a pair of wires carrying differential data comprising:
   a physical link layer device (PHY) comprising a transceiver for differential mode data, the PHY having a first terminal and a second terminal;
   an autotransformer having a first winding, a second winding, and a center tap between the first winding and the second winding, the autotransformer having a third terminal coupled to the first terminal of the PHY, and a fourth terminal coupled to the second terminal of the PHY, wherein the center tap is connected through a low impedance to ground;
   a common mode choke (CMC) having a fifth terminal coupled to the third terminal of the autotransformer, and a sixth terminal coupled to the fourth terminal of the autotransformer, the CMC also having a seventh terminal coupled to a first one of the wires, and an eighth terminal coupled to a second one of the wires; and
   termination circuitry coupled to the pair of wires comprising a first resistor-capacitor circuit coupling the first one of the wires to ground, and a second resistor-capacitor circuit coupling the second one of the wires to ground,
   wherein the CMC and autotransformer significantly attenuate the transmission of common mode noise between the pair of wires and the PHY while not significantly attenuating the transmission of differential mode data signals between the pair of wires and the PHY.

2. A system for filtering AC common mode signals from a pair of wires carrying differential data comprising:
   a physical link layer device (PHY) comprising a transceiver for differential mode data, the PHY having a first terminal and a second terminal;
   an autotransformer having a first winding, a second winding, and a center tap between the first winding and the second winding, the autotransformer having a third terminal coupled to the first terminal of the PHY, and a fourth terminal coupled to the second terminal of the PHY, wherein the center tap is connected through a low impedance to ground; and
   a common mode choke (CMC) having a fifth terminal coupled to the third terminal of the autotransformer, and a sixth terminal coupled to the fourth terminal of the autotransformer, the CMC also having a seventh terminal coupled to a first one of the wires, and an eighth terminal coupled to a second one of the wires,
   wherein the CMC and autotransformer significantly attenuate the transmission of common mode noise between the pair of wires and the PHY while not significantly attenuating the transmission of differential mode data signals between the pair of wires and the PHY, and
   wherein the CMC is AC-coupled to the pair of wires by a first capacitor coupled between the seventh terminal of the CMC and the first one of the wires, and a second capacitor coupled between the eighth terminal of the CMC and the second one of the wires.

3. The system of claim 1 wherein the center tap of the autotransformer is DC coupled to ground.

4. The system of claim 1 wherein the center tap of the autotransformer is AC coupled to ground.

5. The system of claim 1 further comprising a voltage source coupled to the center tap of the autotransformer for supplying a DC potential to the pair of wires in a Power over Ethernet (PoE) network.

6. The system of claim 1 wherein the third terminal of the autotransformer is AC-coupled to the first terminal of the PHY via a first capacitor, and the fourth terminal of the autotransformer is AC-coupled to the second terminal of the PHY via a second capacitor.

7. The system of claim 2 further comprising termination circuitry coupled to the pair of wires comprising a first resistor-capacitor circuit coupling the first one of the wires to ground, and a second resistor-capacitor circuit coupling the second one of the wires to ground.

8. The system of claim 1 wherein the PHY is AC-coupled to the pair of wires by a first capacitor coupled in series between the first terminal and the first one of the wires, and a second capacitor coupled between the second terminal and the second one of the wires.

9. A method for filtering AC common mode signals from a pair of wires carrying differential data comprising:
   transmitting differential data signals over a wire pair, the wire pair having a first wire and a second wire;
   receiving signals on the wire pair by an input of a common mode choke (CMC) having a first winding coupled in series with the first wire and a second winding coupled in series with the second wire, the CMC having an output;
   receiving an output of the CMC by an autotransformer having a third winding, a fourth winding, and a center tap between the third winding and the fourth winding;
   coupling common mode noise signals on the wire pair to ground via a low impedance path between the center tap and ground, and coupling the differential data signals to input terminals of a physical link layer device (PHY) coupled to the autotransformer; and
   AC-coupling the PHY to the wire pair by a first capacitor in series between a first terminal of the PHY and the first wire, and by a second capacitor in series between a second terminal of the PHY and the second wire.

10. The method of claim 9 wherein the CMC and autotransformer significantly attenuate the transmission of the common mode noise signals between the wire pair and the PHY while not significantly attenuating the transmission of the differential data signals between the wire pair and the PHY.

11. The method of claim 9 wherein the first capacitor and the second capacitor are coupled between the CMC and the wire pair.

12. A method for filtering AC common mode signals from a pair of wires carrying differential data comprising:
   transmitting differential data signals over a wire pair, the wire pair having a first wire and a second wire;
   receiving signals on the wire pair by an input of a common mode choke (CMC) having a first winding coupled in series with the first wire and a second winding coupled in series with the second wire, the CMC having an output;
   receiving an output of the CMC by an autotransformer having a third winding, a fourth winding, and a center tap between the third winding and the fourth winding;
   coupling common mode noise signals on the wire pair to ground via a low impedance path between the center tap and ground, and coupling the differential data signals to input terminals of a physical link layer device (PHY) coupled to the autotransformer; and coupling a voltage to the center tap of the autotransformer via a voltage source coupled to ground.

13. The method of claim 12 wherein the voltage source is AC-coupled to ground.

14. The method of claim 12 further comprising supplying a DC potential, generated by the voltage source, to the wire pair in a Power over Ethernet (PoE) network.

15. The method of claim 9 wherein the center tap of the autotransformer is AC coupled to ground.

16. A method for filtering AC common mode signals from a pair of wires carrying differential data comprising:
transmitting differential data signals over a wire pair, the wire pair having a first wire and a second wire;
receiving signals on the wire pair by an input of a common mode choke (CMC) having a first winding coupled in series with the first wire and a second winding coupled in series with the second wire, the CMC having an output;
receiving an output of the CMC by an autotransformer having a third winding, a fourth winding, and a center tap between the third winding and the fourth winding;
coupling common mode noise signals on the wire pair to ground via a low impedance path between the center tap and ground, and coupling the differential data signals to input terminals of a physical link layer device (PHY) coupled to the autotransformer; and
terminating the wire pair via termination circuitry comprising a first resistor-capacitor circuit coupling the first wire to ground, and a second resistor-capacitor circuit coupling the second the wire to ground.

17. A communications system comprising:
a wire pair;
a first physical link layer device (PHY) coupled to a first end of the wire pair via a first terminal and a second terminal of the first PHY, the first PHY comprising a first transceiver for differential mode data signals;
a second PHY coupled to a second end of the wire pair via a third terminal and a fourth terminal of the second PHY, the second PHY comprising a second transceiver for the differential mode data signals;
at least the first PHY being coupled to the wire pair via circuitry comprising:
an autotransformer having a first winding, a second winding, and a center tap between the first winding and the second winding, the autotransformer having a fifth terminal coupled to the first terminal of the first PHY, and a sixth terminal coupled to the second terminal of the first PHY, wherein the center tap is connected through a low impedance to ground; and
a common mode choke (CMC) having a seventh terminal coupled to the fifth terminal of the autotransformer, and an eighth terminal coupled to the sixth terminal of the autotransformer, the CMC also having a ninth terminal coupled to a first one of the wires, and a tenth terminal coupled to a second one of the wires,
wherein the CMC and autotransformer significantly attenuate the transmission of common mode noise between the wire pair and the first PHY while not significantly attenuating the transmission of differential mode data signals between the wire pair and the first PHY; and
a voltage source coupled to the center tap of the autotransformer for supplying a DC potential to the wire pair.

18. The system of claim 17 wherein coupling of the second PHY to the second end of the wire pair is symmetric to the coupling of the first PHY to the first end of the wire pair.

* * * * *